United States Patent
Ferianz (12)

(10) Patent No.: US 6,947,548 B2
(45) Date of Patent: Sep. 20, 2005

(54) DRIVER CIRCUIT FOR SUBSCRIBER TERMINALS

(75) Inventor: Thomas Ferianz, Glanegg (AT)

(73) Assignee: Infineon Technologies AG, München (DE)

( * ) Notice: Subject to any disclaimer, the term of this patent is extended or adjusted under 35 U.S.C. 154(b) by 0 days.

(21) Appl. No.: 10/353,286

(22) Filed: Jan. 29, 2003

(65) Prior Publication Data

US 2003/0152215 A1 Aug. 14, 2003

Related U.S. Application Data

(63) Continuation of application No. PCT/EP01/08668, filed on Jul. 26, 2001.

(30) Foreign Application Priority Data

Aug. 7, 2000 (DE) .......................................... 100 38 374

(51) Int. Cl.[7] ............................................. H04M 19/00
(52) U.S. Cl. ................................... 379/399.01; 379/413
(58) Field of Search ........................... 379/47.3, 399.07, 379/93.05

(56) References Cited

U.S. PATENT DOCUMENTS

| 4,361,811 A | * | 11/1982 | Ormond ...................... 327/345 |
| 5,535,273 A | * | 7/1996 | Kausel et al. ............. 379/399.01 |
| 5,627,501 A | * | 5/1997 | Biran et al. ................. 333/17.1 |
| 6,477,207 B1 | * | 11/2002 | Lindholm .................... 375/260 |

FOREIGN PATENT DOCUMENTS

| DE | 197 40 137 A1 | 3/1999 |
| DE | 198 58 963 A1 | 7/2000 |
| EP | 0 994 610 A2 | 4/2000 |

OTHER PUBLICATIONS

Ledwich, G., DC–DC Converter Basics, © 1998, Power Designers, pp. 9 and 10 (http://www.powerdesigners.com/InfoWeb/design_center/articles/DC-DC/converter.shtm.*

Johns et al., "Integrated Circuits for Data Transmission over Twisted–Pair Channels," IEEE Custom Integrated Circuits Conference, (1996).

Michael Steffes, "Optimizing Performance in An xDSL Line Driver," Electronic Design, ( Apr. 19, 1999).

Moyal et al., "A 25–kft, 768–kb/s CMOS Analog Front End for Multiple–Bit–Rate DSL Transceiver," IEEE Journal of Solid State Circuits, vol. 34 ( No. 12), p. 1961–1972, ( Dec. 12, 1999).

* cited by examiner

*Primary Examiner*—Xu Mei
*Assistant Examiner*—Walter F. Briney, III
(74) *Attorney, Agent, or Firm*—Jenkins, Wilson & Taylor, P.A.

(57) ABSTRACT

Driver circuit for at least one subscriber terminal, comprising a first driver (14) for amplifying the power of a direct-voltage signal applied for supplying power to the subscriber terminal, the first driver (14) being supplied by a first supply voltage ($V_1$), and comprising a second driver (37; 37a, 37b), following the first driver, for modulating high-frequency signal currents onto the power-amplified direct-voltage signal.

28 Claims, 3 Drawing Sheets

DRIVER CIRCUIT FOR SUBSCRIBER TERMINALS

RELATED APPLICATIONS

This application is a continuation of PCT patent application No. PCT/EP01/08668, filed Jul. 26, 2001, which claims priority to German patent application No. 10038374.2, filed Aug. 7, 2000, the disclosures of each of which are incorporated herein by reference in their entirety.

TECHNICAL FIELD

The invention relates to a driver circuit for subscriber terminals with very low power dissipation.

BACKGROUND ART

From DE 19740137 A1, a method and a circuit arrangement for generating AC ringing voltage for electronic subscriber circuits is known. In this arrangement, the operating voltage of a power amplifier is controlled in such a manner that the operating voltage follows the variation with time of an amplified AC ringing voltage in particular time intervals.

DE 19858963 A1 describes an audio signal amplifier with a controllable voltage supply for an amplifier stage and with an analyzing unit for analyzing the audio signal to be amplified. The audio signal amplifier also contains a control unit for controlling the voltage supply in dependence on the analyzed audio signal, and a delay unit 3 which delays the incoming audio signal relative to the audio signal supplied to the analyzing unit.

In conventional communication systems, direct voltage and low-frequency signals and high-frequency signals are frequently transmitted via one signal line or one transmission channel, respectively. The direct voltages are, for example, supply voltages for subscriber terminals. The low-frequency signals are, for example, analog voice signals or ringing tone signals for telephones. The high frequency signals to be transmitted by the communication systems are in most cases data signals such as, for example, xDSL data signals.

FIG. 1 diagrammatically shows an example of a communication system in which low-frequency and high-frequency signals are transmitted via the same line. From a voice and data network, low-frequency voice signals and high-frequency data signals are supplied to a switching center which has a switching device S, for example a multiplexer circuit. The switching device S is connected to a driver circuit T for a subscriber. Each subscriber connected to the switching center has his own driver circuit T. From the driver circuit T, the voice and data signals pass, for example, to a so-called splitter which consists of two filters, namely a high-pass filter HP and a low-pass filter TP. The low-pass filter TP is connected to a telephone which receives the low-frequency voice signals. The high-pass filter HP is connected to a data modem which demodulates and modulates the high-frequency data signals.

As a rule, the direct voltages which are transmitted from the driver circuit T to the circuit and are used, for example, to supply the telephone with voltage, and the low-frequency ringing tone have high signal amplitudes of more than 100 volts. This necessitates a very high supply voltage for the driver circuit T. The high-frequency signal currents which are used, for example, for transmitting data, have a much lower signal amplitude. Due to the lower-valued load impedance, the high-frequency signal currents produce large supply currents which are taken from the supply voltage of the driver circuit T, however.

FIG. 2 shows a driver circuit T of the prior art. The driver circuit T contains an operational amplifier OP which is supplied with voltage by an associated supply voltage source $V_B$ via two supply voltage lines. The input E of the driver circuit T is connected to a low-frequency signal source S1 and a high-frequency signal source S2, the signal currents of which are superimposed. The superposition of the various signal currents or signal components is indicated by a summing element in FIG. 2. The low-frequency voltage source S1 supplies the direct voltages for supplying the terminals and low-frequency signals, particularly low-frequency voice signals. The high-frequency signal source S2 delivers high-frequency data signals with a relatively low signal amplitude. At the output A of the driver circuit T, the entire signal spectrum is available at a low impedance for driving the terminals connected to the output.

As a rule, the supply voltage $V_B$ for the driver circuit T is supplied by a connected power supply.

The disadvantage of the driver stage T of the prior art as shown in FIG. 2 consists in that the supply voltage $V_B$ must be selected to be of such an amplitude that the maximum signal amplitudes of the two signal sources S1 and S2 are not limited in the operational amplifier OP.

The required supply voltage $V_B$ for the operational amplifier OP within the driver stage T can be calculated from the following relation:

$$V_B = \hat{S}_1 + \hat{s}_2 = V_{Drop}$$

where $\hat{S}_1$ ... crest value of the low-frequency signal currents, $\hat{s}_2$ ... crest value of the high-frequency signal currents, $V_{Drop}$ ... design-related voltage drop in the driver circuit.

The power dissipation $P_V$ of the driver circuit T, which is due to the load current is obtained from:

$$P_V = P_G - P_L = V_B \cdot F_2 \cdot i_{1,2} - P_L$$

where $P_V$ load-current-related power dissipation in the driver circuit T, $P_G$ load-current-related total power consumption of the driver circuit T, $P_L$ power delivered to the load, $V_B$ supply voltage of the driver circuit T, $i_{1,2}$ rms value of the total signal current, $F_2$ the form factor, i.e. the signal-shape-dependent ratio between rectified value and rms value of a signal.

The power dissipation of the driver circuit T increases with increasing supply voltage $V_B$ of the driver circuit as can be seen from the equation. Since the supply voltage $V_B$ of the driver circuit T of the prior art is greater than the sum of the two crest values $\hat{s}_1$, $\hat{S}_2$ of the low-frequency and high-frequency signal currents, the necessary supply voltage $V_B$ of the driver circuit T, and thus the power dissipation $P_V$ of the driver circuit T are very high. In the conventional driver circuit T shown in FIG. 2, the power dissipation $P_V$ produced is of such a magnitude that it has hitherto not been possible to implement integrated driver circuits for full-rate ADSL in connection with an analog voice signal transmission without an elaborate housing with very large heat sinks.

SUMMARY OF THE INVENTION

It is, therefore, the object of the present invention to create a driver circuit for transmitting low-frequency and high-frequency signal currents to subscriber terminals, the power dissipation of which is minimum.

According to the invention, this object is achieved by a driver circuit to subscriber terminals, having the features specified in claim 1.

The invention creates a driver circuit for at least one subscriber terminal comprising a first driver for power amplification of a direct voltage signal applied for supplying power to the subscriber terminal, the first driver being supplied by a first supply voltage ($V_1$), and comprising a second driver following the first driver, for modulating high-frequency signal currents onto the power-amplifier direct-voltage signal.

The first driver is preferably followed by a low-pass filter.

In a preferred embodiment, this low-pass filter is a first-order low-pass filter.

The first-order low-pass filter is preferably an RC low-pass filter which contains a resistor and a capacitor.

The resistor is preferably a passive component.

In an alternative embodiment, the resistor is constructed as an active impedance.

The cut-off frequency of the low-pass filter can preferably be adjusted.

This provides the advantage that the driver circuit can be used for various communication standards, for example different DSL standards.

The cut-off frequency of the low-pass filter is preferably between the upper cut-off frequency of the low-frequency signal currents and the lower cut-off frequency of the high-frequency signal currents.

In a preferred embodiment of the driver circuit according to the invention, a first voltage source is provided which has a fixed reference potential for generating the first supply voltage.

The reference potential is preferably the ground potential.

In a further preferred embodiment of the driver circuit according to the invention, a second voltage source is provided for generating the second supply voltage which is connected free of reference potential to the output of the low-pass filter.

In a preferred embodiment of the driver circuit according to the invention, the second supply voltage for the second driver, delivered by the second voltage source, is much lower than the first supply voltage for the first driver, delivered by the first voltage source.

The first driver is preferably an operational amplifier.

In an alternative embodiment, the first driver is an AC/DC converter with current feedback.

In a further alternative embodiment, the first driver is a DC/DC converter with current feedback.

The second driver is preferably an operational amplifier with a linear amplification.

In a further preferred embodiment of the driver circuit according to the invention, a low-frequency signal source can be connected to a signal input of the first driver.

In a further preferred embodiment, a signal input of the second driver is connected to the output of a summing circuit.

In this arrangement, the low-frequency signal source can be preferably connected to a first input of the summing circuit.

The high-frequency signal source can be preferably connected to a second input of the summing circuit.

In an especially preferred embodiment of the driver circuit according to the invention, a third supply voltage source for increasing the signal level at the signal input of the second driver is connected to a third input of the summing circuit.

The third supply voltage source preferably delivers a supply voltage which has half the amplitude of the second supply voltage delivered by the second supply voltage source.

The subscriber terminal can be preferably connected to a signal output of the second driver.

The low-frequency signal currents which are amplified by the first driver preferably comprise direct currents for supplying the subscriber terminal, voice signal currents and ringing tone currents.

The high-frequency signal currents which are amplified by the second driver preferably comprise high-frequency data signal currents.

These high-frequency data signal currents are preferably xDSL data signal currents.

In an especially preferred embodiment of the driver circuit according to the invention, this driver circuit is of differential construction.

In this arrangement, the second driver exhibits two differentially interconnected operational amplifiers which are in each case supplied by a supply voltage free of reference potential.

The two supply voltages free of reference potential are preferably in each case generated by flyback converters, the secondary winding of which is not grounded.

In the further text, preferred embodiments of the driver circuit according to the invention are described with reference to the attached figures, for explaining features essential to the invention.

DETAILED DESCRIPTION OF THE INVENTION

Figure 3:
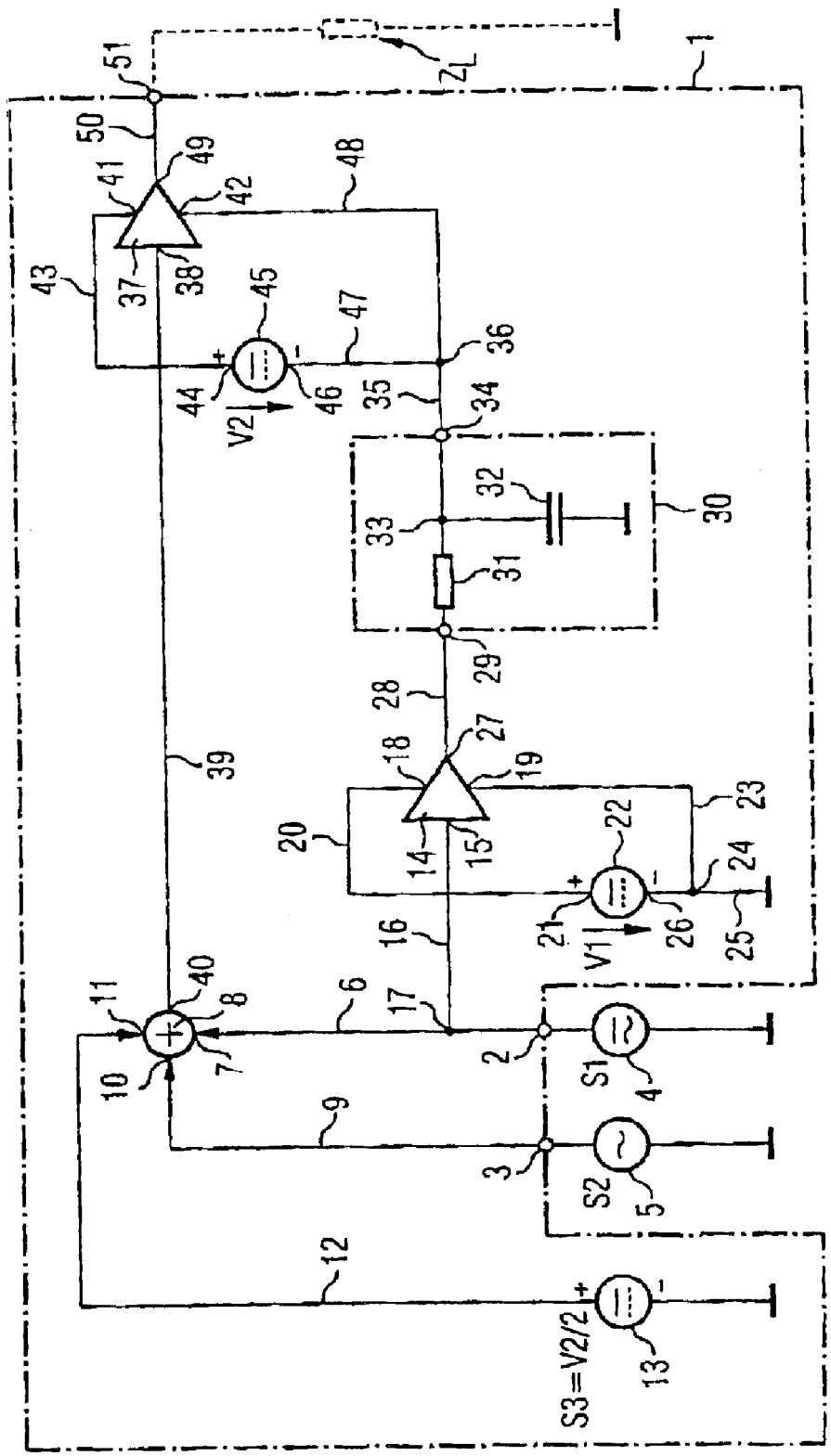
FIG. 3 shows a first embodiment of the driver circuit according to the invention.

In the embodiment shown in FIG. 3, the driver circuit 1 for subscriber terminals according to the invention has two signal inputs 2, 3 for connecting a low-frequency signal source 4 and a high-frequency signal source 5. The low-frequency signal currents delivered by the low-frequency signal source S1 pass from the signal input 2 via a line 6 to a first input 7 of a summing circuit 8. The high-frequency signal currents delivered by the high-frequency signal source 5 are applied to a second input 10 of the summing circuit 8 via a line 9. The summing circuit 8 has a third input 11 to which a third voltage source 13 is connected via a line 12. The summation or superposition of the high-frequency and low-frequency signal currents delivered by the low-frequency signal current source 4 to the high-frequency signal current source 5 can also take place outside the driver circuit 1.

The driver circuit 1 contains a first driver 14 for the low-frequency signal currents, the input 15 of which is connected via an internal line 16 to a branching node 17 with the line 6. The first driver 14 has two supply voltage terminals 18, 19 for applying a first supply voltage $V_1$. The first supply voltage terminal 18 of the driver 14 is connected to a first terminal 21 of a supply voltage source 22 via a supply voltage line 20. The second supply voltage terminal 19 of the driver 14 is connected to a branching node 24 via a line 23. The branching node 24 is located on a line 25 which applies a second terminal 26 of the supply voltage source 22 to the reference potential ground. The signal output 27 of the driver 14 is connected to an input terminal 29 of a low-pass filter 30 via a line 28. The low-pass filter 30 contains a resistor 31 and a capacitor 32. The capacitor 32 of the low-pass filter 30 is connected to a node 33 with the resistor 31 and is connected to the reference potential ground at its opposite terminal.

The low-pass filter 30 shown in FIG. 3 is a first-order low-pass filter, the circuit of which can be produced with very little expenditure. The resistor 31 is either a passive component or an active impedance which is implemented by impedance synthesis. This can be, for example, an active output impedance of the driver 14. The cut-off frequency $f_g$ of the low-pass filter 30 is preferably adjustable. For this purpose, the resistance of the resistor 31 or the capacity of the capacitor 32 is preferably changed. In an alternative embodiment, the resistance value of the resistor 31 can be programmed. The cut-off frequency $f_g$ of the low-pass filter 30 is between the upper cut-off frequency of the low-frequency signal currents, for example 4 kHz for voice signals, and the lower cut-off frequency of the high-frequency signal currents, for example 138 kHz for DSL data signal currents. An output 34 of the low-pass filter 30 is connected to a node 36 via a line 35.

The driver circuit 1 according to the invention contains a second driver 37, the signal input 38 of which is connected to the output 40 of the summing circuit 8 via a line 39. The second driver 37 exhibits a first supply voltage terminal 41 and a second supply voltage terminal 42. The first supply voltage terminal 41 of the driver 37 is connected to a first terminal 44 of a supply voltage source 45 via a supply voltage line 43. The supply voltage source 45 exhibits a second supply voltage terminal 46 which is connected to the node 34 via a line 47. The second supply voltage terminal 42 of the driver 37 is also connected to the node 36 via a supply voltage line 48. The second voltage source 45 for generating the second supply voltage for the driver 37 is connected free of reference potential to the output 34 of the low-pass filter 30 as can be seen from FIG. 3. The amplitude of the supply voltage $V_2$ free of reference potential of the supply voltage source 45 is adapted to the signal amplitudes of the high-frequency signal currents and high-frequency signals, respectively.

At the signal input 38 of the driver 37, the supply voltage source 13 produces a constant increase in signal level by a voltage which is delivered by the supply voltage source 13. The supply voltage delivered by the supply voltage source 13 is preferably one half of the supply voltage $V_2$ delivered by the supply voltage source 45. This makes it possible to modulate the driver 37 fully within its supply voltage range.

The output 49 is connected to an output 51 of the driver circuit 1 via a line 50. The subscriber device can be connected to the output 51 of the driver circuit 1 via protective circuits. The subscriber terminals connected and the line between the driver circuit 1 and the subscriber terminals have a complex impedance $Z_L$.

The supply voltage $V_1$ of the first supply voltage source 22 for supplying voltage to the first driver 14 is obtained as follows:

$$V_1 = \hat{S}_1 + V_{Drop1}$$

where $\hat{S}_1$ is the sum of the crest values of the direct-voltage signal, the ringing tone signal and possibly of the voice signal, $V_{Drop1}$ is the design-related voltage drop in the driver circuit 14.

The supply voltage $V_2$ delivered by the second supply voltage source 45 for supplying voltage to the second driver 37 is obtained as follows:

$$V_2 = \hat{S}_2 + V_{Drop2}$$

where $\hat{S}_2$ is the crest value of the high-frequency signal currents and possibly of the voice signal, $V_{Drop2}$ is the design-related voltage drop in the driver circuit 37.

This provides the load-current-related power dissipation of the overall driver circuit 1 from:

$$P_V = P_G - P_L = P_{V1} + P_{V2} - P_L = V_1 \cdot F_1 \cdot i_1 + V_2 \cdot F_2 \cdot i_{1,2} - P_L$$

where:

$P_V$ is the load-current-related power dissipation in the overall driver circuit $P_G$ is the load-current-related total power consumption of the overall driver circuit $P_L$ is the power delivered to the load $Z_L$ $V_1$ is the supply voltage of the driver circuit 14

$V_2$ is the supply voltage of the driver circuit 37

$i_{1,2}$ is the rms value of the total signal current $i_1$ is the rms value of the DC signal current and of the low-frequency signal currents $F_1$ is the form factor, i.e. the signal-shape-dependent ratio between the rectified value and the rms value of the high-frequency signal $F_2$ is the form factor, i.e. the signal-shape-dependent ratio between the rectified value and the rms value of the total output signal.

Figure 1:
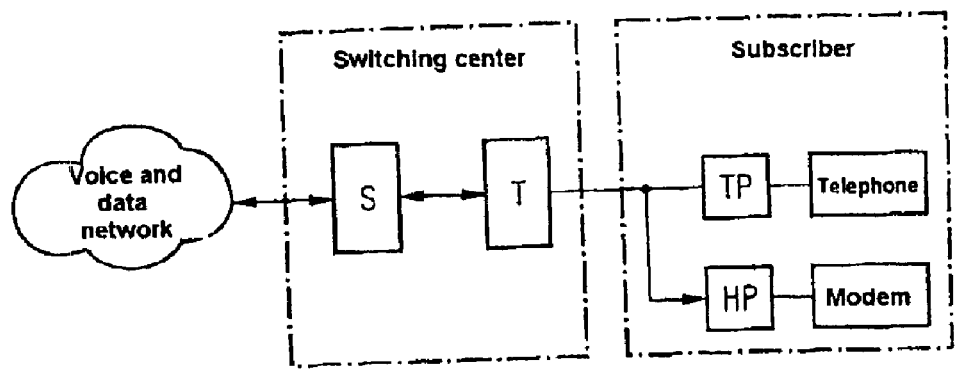
FIG. 1 shows the structure of a communication system for transmitting high-frequency and low-frequency signals on a line according to the prior art.
Figure 2:
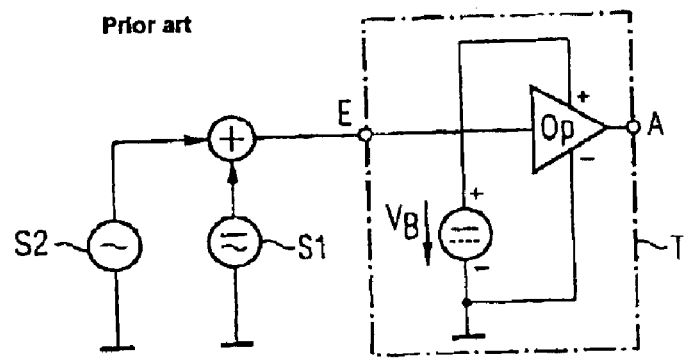
FIG. 2 shows a driver circuit T according to the prior art.

As a comparison between the two equations 2,6 shows, the power dissipation of the driver circuit according to the invention is much less than in the conventional driver circuit T shown in FIG. 2.

Figure 4:
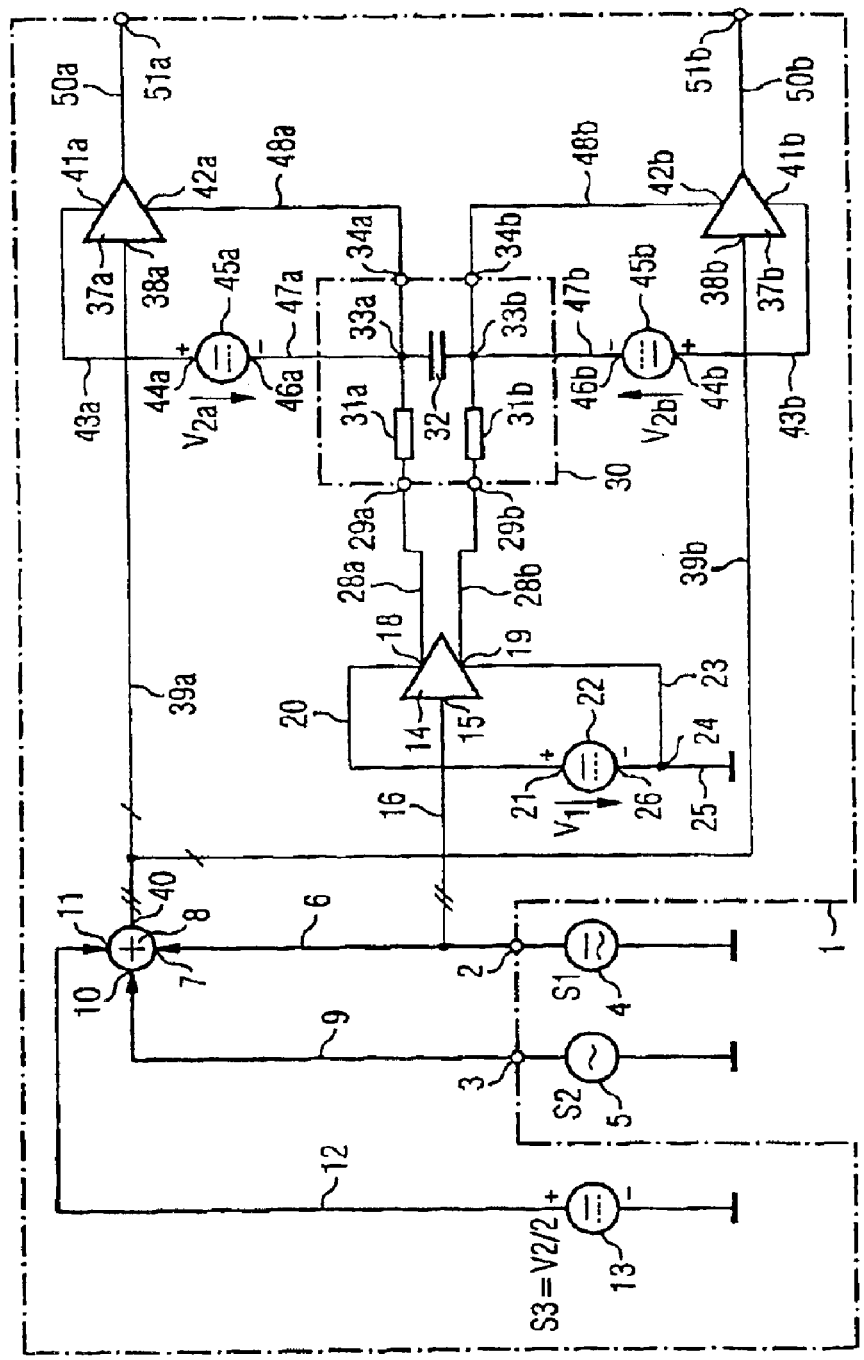
FIG. 4 shows a second embodiment of the driver circuit according to the invention.

FIG. 4 shows an especially preferred embodiment of the driver circuit 1 according to the invention. The preferred embodiment of the driver circuit 1 shown in FIG. 4 is of differential construction. The second driver 37 consists of two differentially interconnected operational amplifiers 37a, 37b which are in each case supplied by an associated supply voltage $V_{2a}$, $V_{2b}$ free of reference potential. The two supply voltages $V_{2a}$, $V_{2b}$ free of reference potential are preferably in each case generated by flyback converters, the secondary winding of which is not grounded.

In comparison with the conventional driver circuit T as shown in FIG. 2, the power dissipation of the driver circuit 1 according to the invention is very low as is proven by the following example.

Assuming a ringing tone signal of 65 Vrms/20 Hz as low-frequency current component and a full-rate ADSL signal with 20 dBm transmit power as high-frequency signal current on the line, the following values are obtained:

Voltage crest value $\hat{S}_1$ of the low-frequency signals $$\hat{S}_1 = 110V;$$

Voltage crest value $\hat{S}_2$ of the high-frequency signals $$\hat{S}_2=35V;$$

Design-related voltage drop of the driver circuit T of the prior art $V_{Drop}=15V$;

Thus, the supply voltage of the driver circuit T of the prior art is:

$$V_B=\hat{S}_1+\hat{S}_2+V_{Drop}=160V$$

$P_L=950$ mW
$i_{1,2}=32$ mA
$F_1=0.85$
$F_2=0.9$

The load-current-related power dissipation $P_V$ in the driver circuit T of the prior art is:

$$P_V=P_G-P_L=V_B\cdot F\cdot i_{1,2}-P_L=160V\cdot 0.85\cdot 32\text{ mA}-950\text{ mW}=3.4\text{ W}$$

By comparison, the following is obtained for the driver circuit 1 according to the invention as shown in FIG. 4:
with $\hat{S}_1=110V$
$V_{Drop1}=10V$
a first supply voltage obtained for the first driver 14 is $$V_1=\hat{S}_1+V_{Drop1}=120V$$

with $\hat{S}_2=35V$ and
$V_{Drop2}=5V$
the supply voltage for the second driver is $$V_{2a}, V_{2b}=\hat{S}_2+V_{Drop2}=40V$$

with $P_L=950$ mW
$i_1=11$ mA
$i_{1,2}=32$ mA
$F_1=0.85$
$F_2=0.9$

The power dissipation $P_V$ of the driver circuit 1 according to the invention is thus:

$$\begin{aligned}P_V &= P_G - P_L = P_{V1} + P_{V2} - P_L \\ &= V_1\cdot F_1 \cdot i_1 + V_2\cdot F_2 \cdot i_{1,2} - P_L \\ &= 120\text{ V}\cdot 0.85\cdot 11\text{ mA} + 40\text{ V}\cdot 0.9\cdot 32\text{ mA} - 950\text{ mW} \\ &= 1.324\text{ W}\end{aligned}$$

Accordingly, the saving in power dissipation $\Delta P$ of the driver circuit 1 according to the invention as shown in FIG. 4 compared with the conventional driver circuit T as shown in FIG. 2 is:

$$\Delta P=3.4W-1.324W=2.076W$$

The driver circuit 1 according to the invention separates the frequencies of the signal circuits into two signal paths. Due to the novel design of the supply voltage concept which provides for dividing the signal current paths with respect to frequency, considerable savings in power dissipation can be achieved by the driver circuit 1 according to the invention. In conventional ADSL systems, the ADSL signals are generated by special modems and looped into the telephone line via elaborate and cost-intensive analog filters or splitters. The voice and ringing tone signals are regenerated by analog so-called line cards. The splitter provides for a parallel connection of the driver for low-frequency signals from the analog line card and the driver for the high-frequency signals from the ADSL modem. The two signal current paths are separated at signal level. As a result, the splitters must consist of analog filters with very high filter orders. Filters having such high filter orders can only be produced at very high costs.

In the driver circuit 1 according to the invention, by comparison, the signal current paths are separated at the supply voltage level as a result of which it is sufficient to use a very simple first-order low-pass filter 30. The driver circuit 1 according to the invention can, therefore, be produced with very little cost expenditure.

The reduction in power dissipation by the circuit configuration of the driver circuit 1 according to the invention allows the driver circuit to be integrated into a simple housing having very small heat sinks.

The driver circuit 1 according to the invention also has the following further advantages.

The quiescent current flowing in the driver circuit 37 is very high due to the necessary frequency bandwidth of the circuit. This quiescent current now exclusively flows via the supply voltage $V_2$ which is much lower than the supply voltage $V_1$. This ensures further considerable saving in power dissipation.

A further advantage consists in that for the low-frequency signal currents in the first driver 14, lower current limiting values can now be specified than for the total signal current in the driver 37. This results in higher overcurrent endurance of the driver circuit 1 according to the invention.

A further advantage consists in that, due to the much lower supply voltage $V_2$ for the second driver 37, this driver 37 can be constructed with faster transistors having a lower dielectric strength. This considerably facilitates the achievement of the necessary wide bandwidth.

LIST OF REFERENCE DESIGNATIONS:

1 Driver circuit
2 Signal input
3 Signal input
4 Low-frequency signal source
5 High-frequency signal source
6 Line
7 Summing element input
8 Summing element
9 Line
10 Summing element input
11 Summing element input
12 Line
13 Voltage source
14 First driver
15 Driver input
16 Line
17 Branching node
18 Supply voltage terminal
19 Supply voltage terminal
20 Supply voltage line
21 Voltage source terminal
22 Voltage source
23 Supply voltage line
24 Node
25 Line
26 Voltage source terminal
27 Driver output
28 Line
29 Filter input
30 Low-pass filter
31 Resistor 32 Capacitor
33 Node
34 Filter output
35 Line
36 Node
37 Second driver
38 Driver input
39 Line
40 Summing element output
41 Supply voltage terminal
42 Supply voltage terminal
43 Supply voltage line
44 Voltage source terminal
45 Voltage source
46 Voltage source terminal
47 Line
48 Supply voltage line
49 Driver output
50 Line
51 Driver output

What is claimed is:

1. Driver circuit for at least one subscriber terminal, comprising:
   (a) a first driver for amplifying the power of a direct current for supplying power to the subscriber terminal, for amplifying the power of low frequency voice signal currents and of a ringing tone current, the first driver being supplied by a first supply voltage, and comprising
   (b) a second driver following the first driver for modulating high-frequency data signal currents onto the signal currents power-amplified by the first driver, the second driver being connected downstream with its supply terminals connected to the output terminals of the first driver and being connected with its input terminals parallel with respective input terminals of the first driver, the second driver being supplied by a second supply voltage being arranged between the supply terminals of the second driver and connected to the output terminal of the first driver.

2. Driver circuit according to claim 1, wherein the first driver is followed by a low-pass filter.

3. Driver circuit according to claim 2, wherein the low-pass filter is a first-order low-pass filter.

4. Driver circuit according to claim 3, wherein the first-order low-pass filter is an RC low-pass filter with a resistor and a capacitor.

5. Driver circuit according to claim 4, wherein the resistor is a passive component.

6. Driver circuit according to claim 4, wherein the resistor is an active impedance.

7. Driver circuit according to claim 2, wherein the low-pass filter comprises an adjustable cut-off frequency $f_G$.

8. Driver circuit according to claim 7, wherein the cut-off frequency $f_G$ of the low-pass filter is between an upper cut-off frequency of low-frequency signal currents and a lower cut-off frequency of the high-frequency signal currents.

9. Driver circuit according to claim 1, wherein a first voltage source is provided for generating a first voltage which has a fixed reference potential.

10. Driver circuit according to claim 9, wherein a second voltage source for generating a second supply voltage is provided which is connected free of reference potential to an output of a low-pass filter following the first driver.

11. Driver circuit according to claim 10, wherein the second supply voltage for the second driver, delivered by a second voltage source, is much lower than the first supply voltage for the first driver, delivered by the first voltage source.

12. Driver circuit according to claim 1, wherein the first driver is an operational amplifier.

13. Driver circuit according to claim 1, wherein the first driver is a DC/DC converter with current feedback.

14. Driver circuit according to claim 1, wherein the first driver is an AC/DC converter with current feedback.

15. Driver circuit according to claim 1, wherein the second driver is an operational amplifier.

16. Driver circuit according to claim 1, wherein a low-frequency signal source can be connected to a signal input of the first driver.

17. Driver circuit according to claim 1, wherein an output of a summing circuit is connected to a signal input of the second driver.

18. Driver circuit according to claim 17, wherein the low-frequency signal source can be connected to a first input of the summing circuit.

19. Driver circuit according to claim 17, wherein the high-frequency signal source can be connected to a second input of the summing circuit.

20. Driver circuit according to claim 17, wherein a third supply voltage source is connected to a third input of the summing circuit to increase the signal level at the signal input of the second driver.

21. Driver circuit according to claim 20, wherein a second voltage source for generating a second supply voltage is provided which is connected free of reference potential to an output of a low-pass filter following the first driver, and wherein the third supply voltage source delivers a supply voltage which has half the amplitude of the second supply voltage.

22. Driver circuit according to claim 1, wherein the subscriber terminal can be connected to a signal output of the second driver.

23. Driver circuit according to claim 1, wherein the data signal currents are xDSL data signal currents.

24. Driver circuit according to claim 1, wherein the driver circuit is of differential construction.

25. Driver circuit according to claim 24, wherein the second driver consists of two differentially interconnected operational amplifiers which are in each case supplied by a supply voltage free of reference potential.

26. Driver circuit according to claim 25, wherein the two supply voltages free of reference potential are in each case generated by a flyback converter, the secondary winding of which is not grounded.

27. Driver circuit according to claim 1, wherein the voice signal currents comprise a low frequency signal.

28. Driver circuit according to claim 1, wherein the second driver is connected downstream to the first driver with supply terminals, and the second driver is connected parallel with input terminals to respective input terminals of the first driver.

* * * * *